United States Patent [19]
Yi et al.

[11] Patent Number: 5,663,084
[45] Date of Patent: Sep. 2, 1997

[54] METHOD FOR MANUFACTURING NONVOLATILE SEMICONDUCTOR MEMORY DEVICE

[75] Inventors: Jeong-hyong Yi, Kwacheon; Jeong-hyuk Choi, Seoul, both of Rep. of Korea

[73] Assignee: Samsung Electronics Co., Ltd., Suwon, Rep. of Korea

[21] Appl. No.: 439,086

[22] Filed: May 11, 1995

[30] Foreign Application Priority Data

May 13, 1994 [KR] Rep. of Korea ............... 94-10489

[51] Int. Cl.⁶ ................................................ H01L 21/8247
[52] U.S. Cl. .................... 438/453; 438/201; 438/258; 438/588
[58] Field of Search ..................... 437/43, 52; 257/315

[56] References Cited

U.S. PATENT DOCUMENTS

| | | | |
|---|---|---|---|
| 4,780,431 | 10/1988 | Maggioni et al. | 437/43 |
| 5,188,976 | 2/1993 | Kume et al. | 437/43 |

FOREIGN PATENT DOCUMENTS

| | | | |
|---|---|---|---|
| 8050771 | 3/1983 | Japan | 437/43 |
| 2045165 | 2/1987 | Japan | 437/43 |
| 2266329 | 5/1988 | Japan | 437/43 |
| 3009572 | 1/1991 | Japan | 437/43 |
| 6151783 | 5/1994 | Japan | 437/43 |

Primary Examiner—Tom Thomas
Assistant Examiner—Toniae M. Thomas
Attorney, Agent, or Firm—Cushman Darby & Cushman, IP Group of Pillsbury Madison & Sutro LLP

[57] ABSTRACT

A method for manufacturing a nonvolatile memory device having a memory cell array and a peripheral circuit portion which includes the steps of forming a field oxide film on a semiconductor substrate to form an active region and an isolation region; forming a first dielectric layer on the entire surface of the substrate where the field oxide film is formed; forming a first conductive layer on the dielectric layer; patterning the conductive layer to form a first conductive pattern in the memory cell array and in the peripheral circuit portion; forming a second dielectric layer on the entire surface of the substrate where the first conductive pattern is formed; selectively etching the second dielectric layer, first conductive pattern, and first dielectric layer formed in the peripheral circuit portion to expose the surface of the substrate in the peripheral circuit portion; forming a third dielectric layer on the substrate of the exposed peripheral circuit portion and on the second dielectric layer of the cell array; forming a second conductive layer on the entire surface of the substrate where the third dielectric layer is formed; and patterning the second conductive layer, second dielectric layer, third dielectric layer, and first conductive layer to form a gate electrode in the peripheral circuit portion, and a control gate, a floating gate, and an upper dielectric layer in the cell array.

20 Claims, 8 Drawing Sheets

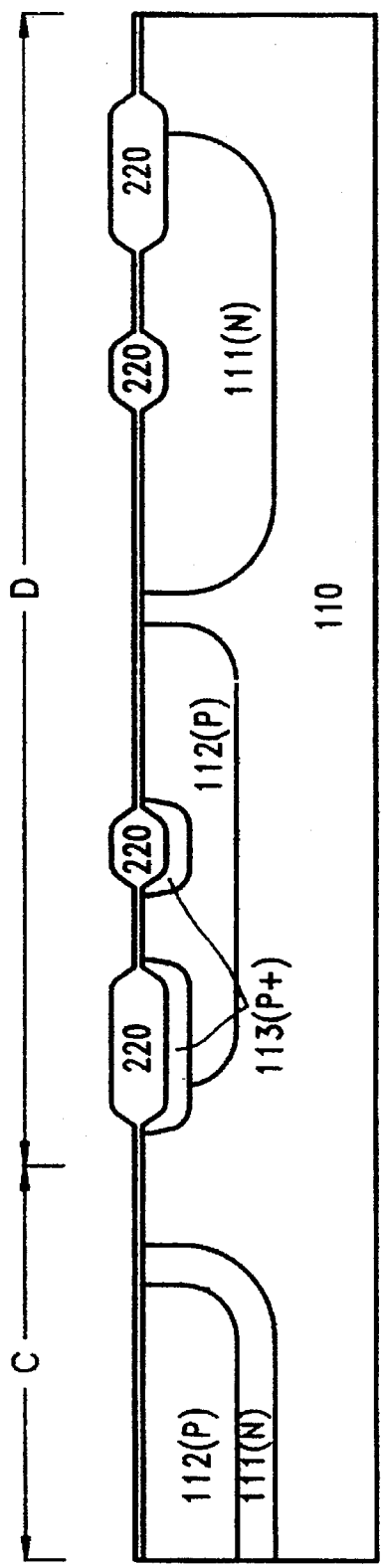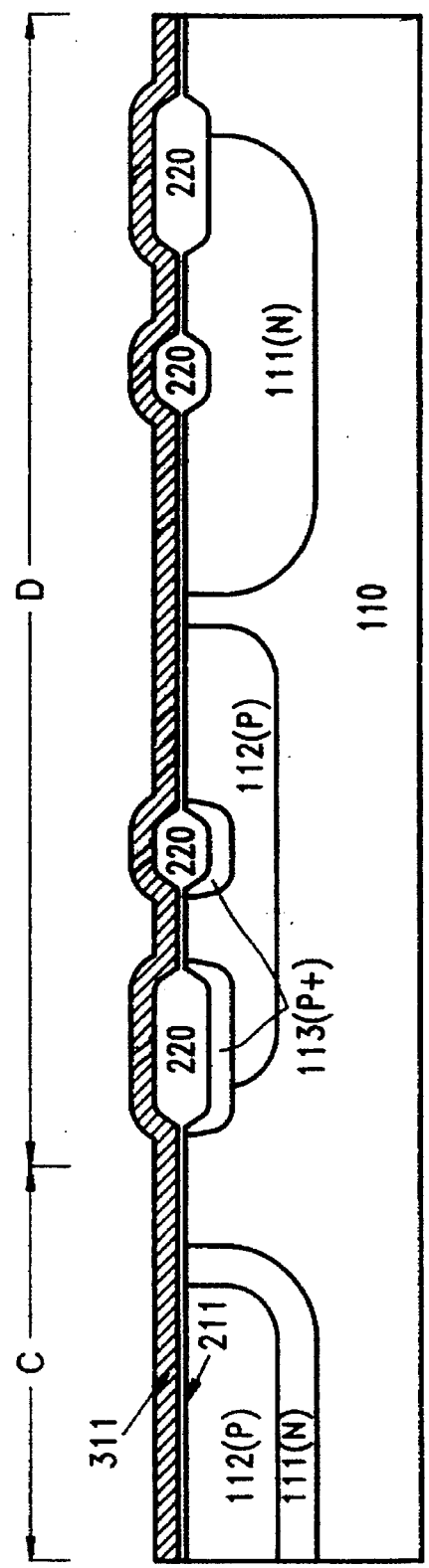

METHOD FOR MANUFACTURING NONVOLATILE SEMICONDUCTOR MEMORY DEVICE

BACKGROUND OF THE INVENTION

The present invention relates to a method for manufacturing a nonvolatile semiconductor memory device (hereinafter called a "nonvolatile memory device"), and more particularly, to a method for manufacturing a nonvolatile semiconductor memory device which prevents operational degradation and maintains isolation between transistors.

In a data processing system, memory devices for storing information are extremely important. As such memory devices, there are volatile memory devices that lose memory contents when power is interrupted and nonvolatile memory devices that retain memory contents even without power supply. Nonvolatile memory devices can be roughly divided into read only memory (ROM) devices that can read data stored therein and electrically erasable & programmable read only memory (EEPROM) devices that can modify the stored data by employing an electrical method. A flash memory device, all the contents therein being able to be erased simultaneously, is an example of an EEPROM. As a nonvolatile memory device, the EEPROM widely uses structure adopting a MOS floating gate electrode which is composed of conductive material electrically isolated from the semiconductor substrate. Such a floating gate electrode is capacitively combined with the semiconductor substrate and senses a charge state. Accordingly, the MOS transistor is "on" or "off" depending on whether there is a charge on the floating gate electrode, and thereby stores a data bit "1" or "0." For injecting and removing a charge to the floating gate electrode, hot electrons generated by avalanche breakdown, and a tunneling effect can be used.

Meanwhile, the nonvolatile memory device needs a high voltage (approximately 20 V) for writing and erasing data. The voltage can be obtained from a booster circuit of a periphery circuit portion. Thus, isolation between transistors is an extremely important factor for maintaining the function of the device. The field oxide film thickness and the impurity concentration of an impurity region, used for separating the active regions, are key factors for determining transistor isolation characteristics. The field oxide film is formed thickly to improve isolation, specifically in EEPROM and flash memory devices, because the field oxide film becomes thinner as the manufacturing process progresses and a predetermined thickness is required after the last step to ensure isolation capability for a high voltage transistor. In addition, transistor isolation becomes a more important factor as the device becomes highly integrated. In contrast, however, the field oxide film thickness has to be made thinner as device integration increases.

FIG. 1 is a section view showing the conventional nonvolatile memory device before an intermediate isolating layer for a metal wire is deposited. In more detail, the nonvolatile memory device comprises a memory cell array (portion A) consisting of floating gate 301 for storing data and control gate 302 for receiving an applied voltage, and a peripheral circuit portion (portion B) consisting of various driving transistors.

The cell array includes an N-type impurity region (N-well 101) and a P-type impurity region (P-well 102) on P-type substrate 100. In addition, N-type high concentration impurity region 104 is formed near the surface of the substrate and serves as a source or drain. A lower dielectric layer (tunnel oxide film 201) consisting of a pure oxide film or an oxynitride film for utilizing a tunneling effect is formed on the substrate. A floating gate 301 is provided on lower dielectric layer 201, and control gate 302 is formed on floating gate 301 having upper dielectric layer 210 as a medium. Floating gate 301 (first electrode layer) is located between upper and lower dielectric layers 201 and 210 and is generally formed of N-type impurity doped polysilicon. Control gate 302 (second electrode layer) is located on upper dielectric layer 210 and is generally formed of polysilicon and a metal-silicon composite so as to obtain low resistance. In addition, upper dielectric layer 210 is formed by an oxide-nitride-oxide (ONO) film in order to obtain high capacitance.

Peripheral circuit portion B includes a P-type impurity region (P-well 102) and an N-type impurity region (N-well 101) formed on P-type semiconductor substrate 100. The peripheral circuit portion structure is formed by a general CMOS process technique. A high concentration N-type impurity region 104 in a P-type impurity region (p-well 102) for making a CMOS N-type transistor is formed simultaneously with the cell array (portion A). Thus, N-type impurity region 104 can serve as a source or drain. On the contrary, the CMOS P-type transistor is formed by a high concentration P-type impurity region 105 in the N-type impurity region (N-well 101). Thus, the P-type impurity region 105 can serve as a source or drain. In addition, the N-type transistor of the peripheral circuit portion is electrically isolated by employing field oxide film 200 and high concentration P-type impurity region 103 which is located below field oxide film 200. The P-type transistor is isolated by employing only field oxide film 200. In addition, the control gate electrode 302 of a peripheral circuit portion transistor is formed by the same film as that of the second electrode layer of the cell array having gate oxide film 202 as a medium.

FIG. 2 to FIG. 9 are section views showing a method for manufacturing the nonvolatile memory device shown in FIG. 1 according to the process sequence.

In the same manner as shown in FIG. 1, the nonvolatile memory device includes a cell array (portion A) where a floating gate for storing data and a control gate for receiving an applied voltage are formed and a peripheral circuit portion (portion B) where various transistors required for driving the device are formed. Specifically, the peripheral circuit portion (B) of FIG. 4 to FIG. 9 is a part of portion B shown in FIG. 2 and FIG. 3, which is truncated for the convenience of explanation.

FIG. 2 shows the steps of forming an N-type impurity region (N-well region 101) and a P-type impurity region (P-well region 102) on the peripheral circuit portion and cell array of a semiconductor substrate by a conventional CMOS process.

First, an N-type impurity is injected into the peripheral circuit portion of P-type silicon substrate 100 and into a predetermined region of the cell array by employing a general photo-etching process and ion-implantation technique. Then, the resultant structure is heat-treated and the N-type impurity is diffused to the desired depth, thereby forming N-type impurity region (N-well 101). Then, in the same manner as that of forming N-type impurity region 101, a P-type impurity is injected into the peripheral circuit portion of P-type silicon substrate 100 and into predetermined N-well region 101 of the cell array by employing a general photo-etching process and ion-implantation technique. Then, the resultant structure is heat-treated and the P-type impurity is diffused to the desired depth, thereby forming a P-type impurity region (P-well 102).

Then, to electrically isolate the devices, field oxide film 200 is formed to a thickness of 5,000 Å to 6,000 Å by employing a general photo-etching process and a device isolation process (for example, LOCOS). In order to further strengthen the electrical isolation prior to forming the field oxide film, a channel-stopping impurity (for example, a high concentration boron) is ion-implanted into the region where the field oxide film of P-type impurity region 102 and the cell array region is to be grown. Thus, the channel-stopping impurity can be diffused to the part of an active region when field oxide film 200 is formed. Then, the unnecessary film material (for example, an oxide or nitride film) which is formed when the field oxide film is formed on a substrate and an ion-implantation is performed, is removed. Thus, the surface of the substrate is confined by field oxide film 200.

FIG. 3 shows the steps of forming first dielectric layer 201 and first conductive layer 301 on the entire surface of the substrate where field oxide film 200 is formed.

In more detail, first dielectric layer 201 (as a lower dielectric layer) is formed by an oxide film or oxynitride film having a thickness of 70 Å to 100 Å all over the substrate where isolated field oxide film 200 is formed. The first dielectric layer is used as a tunnel oxide film. Then, as a conductive material for forming a floating gate, first conductive layer 301 is formed by depositing polycrystalline silicon to a thickness of 1,500 Å to 2,000 Å on lower dielectric layer 201, by employing a CVD method. Then, first conductive layer 301 is made conductive by depositing POCl$_3$ which contains a large quantity of phosphorous.

FIG. 4 shows the steps of forming first conductive pattern 301a by etching the above-formed first conductive layer 301.

First, a photoresist is coated onto first dielectric layer 201 and the resultant structure is patterned, to thereby form photo-resist pattern 400 partially in the cell array. Then, first conductive layer 301 formed in the peripheral circuit portion and in part of the cell array is selectively etched using the photo-resist pattern as an etching mask, to 10 thereby form first conductive pattern 301a.

FIG. 5 shows the steps of forming second dielectric layer 210 on the entire surface of first conductive pattern 301a and substrate 100.

In more detail, after photoresist pattern 400 used for the etching process is removed, second dielectric layer 210 is formed all over first conductive pattern 301a and substrate 100. Second dielectric layer 210 is formed as a composite layer of oxide/nitride/oxide (ONO).

FIG. 6 shows the steps of patterning second dielectric layer 210 and forming second dielectric pattern 210a.

First, a photoresist is deposited on second dielectric layer 210 and the resultant structure is patterned, to thereby form photoresist pattern 400a in a cell array. Then, in order to manufacture a transistor in the peripheral circuit portion, second dielectric layer 210 and first dielectric layer 201 formed in the peripheral circuit portion are etched using photoresist pattern 400a as an etching mask. When second dielectric layer 210 formed in the peripheral circuit portion is completely etched, second dielectric pattern 210a is formed in the cell array.

Specifically, when second dielectric layer 210 consisting of an ONO film formed in the peripheral circuit portion is etched, the thickness of field oxide film 200 is reduced by as much as the dimension 500 since the selective ratio of ONO film-to-field oxide film 200 or ONO film-to-first dielectric layer 201 is generally low, i.e., 2:1 to 5:1. In addition, micro-pitting 600 is generated on the surface of the silicon where a transistor is to be formed. The decrease of the field oxide film and the micro-pitting generated on the surface of the silicon deteriorate transistor isolation and thus cause operational degradation.

FIG. 7 shows the steps of forming second conductive layer 302 on the entire surface of the substrate where second dielectric pattern 210a is formed.

First, photoresist pattern 400a employed for etching second dielectric layer 210 of the peripheral circuit portion is removed. After an oxide film as third dielectric layer 202 is formed to a thickness of 100 Å to 300 Å, a polycrystalline silicon is formed to a thickness of 1,500 Å on the entire surface of the peripheral circuit portion and cell array. At this time, the cell array is not oxidized due to second dielectric pattern 210a consisting of an ONO film. Then, a refractory metal silicide layer (not shown) is formed to a thickness of 1,500 Å on the polycrystalline silicon, to thereby complete second conductive layer 302.

FIG. 8 shows the steps of patterning second conductive layer 302.

A photoresist is deposited on second conductive layer 302 and the resultant structure is patterned, to thereby form photoresist pattern 400b in the cell array and in part of the peripheral circuit portion. Then, second conductive layer 302, a metal silicide layer (not shown), second dielectric pattern 210a and first conductive pattern 301a are selectively etched, using photoresist pattern 400b as an etching mask.

FIG. 9 shows the steps of forming gate electrode 302a in the peripheral circuit portion, control gate 302b in a cell array, floating gate 301b and an upper dielectric layer 210b.

First, photoresist pattern 400b is removed and an N-type impurity is ion-implanted by a self-alignment method. Then, the resultant structure is heat-treated, to thereby form N-type impurity region 104 in the cell array. Thus, control gate 302b consisting of second conductive layer 302 and a metal silicide (not shown) is formed and upper dielectric layer 210b and floating gate 301b are formed in the lower portion of control gate 302b.

In the nonvolatile semiconductor memory device manufactured according to the above-described method, a process for removing the first conductive layer, the second dielectric layer and the first dielectric layer in the peripheral circuit portion is inevitable since a transistor of the peripheral circuit portion which requires a high operation voltage, for example, approximately 20V, has to be formed. Specifically, when the first and second dielectric layers of the peripheral circuit portion are removed, the selective ratio of the second dielectric layer to a field oxide film or the second dielectric layer to the first dielectric layer is not high. Therefore, the field oxide film becomes much thinner. In addition, micro-pitting is generated in the surface of the silicon where a transistor is to be formed. The decrease of the field oxide film and the micro pitting generated on the surface of the silicon weaken transistor isolation and cause operation degradation.

SUMMARY OF THE INVENTION

Accordingly, it is an object of the present invention to provide a method for manufacturing a nonvolatile semiconductor memory device which can prevent the deterioration of device isolation and the operational degradation for highly integrated devices.

To accomplish the above object, there is provided a method for manufacturing a nonvolatile memory device having a memory cell array and a peripheral circuit portion, the method comprising the steps of: (a) forming a field oxide film on a semiconductor substrate so that an active region and an isolation region can be formed; (b) forming a first dielectric layer on the entire surface of the substrate where the field oxide film is formed; (c) forming a first conductive layer on the first dielectric layer; (d) patterning the first conductive layer so that a first conductive pattern can be formed in the memory cell array and in the peripheral circuit portion; (e) forming a second dielectric layer on the entire surface of the substrate where the first conductive pattern is formed; (f) selectively etching the second dielectric layer, first conductive pattern and first dielectric layer formed in the peripheral circuit portion, to thereby expose the surface of the substrate in the peripheral circuit portion; (g) forming a third dielectric layer on the substrate of the exposed peripheral circuit portion and on the second dielectric layer of the cell array; (h) forming a second conductive layer on the entire surface of the substrate where the third dielectric layer is formed; and (i) patterning the second conductive layer, second dielectric layer, third dielectric layer and first conductive layer, to thereby form a gate electrode in the peripheral circuit portion, and a control gate, a floating gate and an upper dielectric layer in the cell array.

The step (i) further comprises the steps of forming a source and drain region in a predetermined portion of the semiconductor substrate by injecting an impurity of the opposite conductivity with respect to the semiconductor substrate and connecting the control gate, source and drain region via a metal process and contact process.

The step (f) includes the steps of selectively etching the second dielectric layer and the first conductive pattern formed in the peripheral circuit portion by using a high selectivity and selectively etching the first conductive layer and the first dielectric layer formed in the peripheral circuit portion by using a high selectivity.

In addition, the first conductive pattern is formed to be isolated from the second conductive layer and the silicon substrate by employing the first and second dielectric layers, and the first dielectric layer is formed by an oxide film or a oxynitride film.

The second dielectric layer is formed as a composite film consisting of oxide/nitride/oxide. Specifically the second dielectric layer is formed as follows. A nitride having a thickness of 100 Å to 200 Å is deposited onto an oxide film having a thickness of 40 Å to 70 Å and the resultant structure is thermally oxidized so that the total thickness of the second dielectric layer is 130 Å to 200 Å when the second dielectric layer is converted to an oxide film.

In addition, the first conductive layer is formed by a polysilicon, and second conductive layer is formed by a composite film consisting of a polysilicon and a metal-silicon composite. Specifically, the metal-silicon composite is formed by a tungsten silicon composite.

There is provided a method for manufacturing a nonvolatile semiconductor having a stacked-gate structured cell transistor and a single-gate structured peripheral circuit transistor, the method comprising the steps of: forming a field oxide film on a semiconductor substrate to define an active region and an isolation region; forming a first dielectric layer on the entire surface of the substrate where the field oxide film is formed; forming a first conductive pattern in a predetermined region of the semiconductor substrate where the cell transistor and peripheral circuit transistor are formed; forming a second dielectric layer on the entire surface of the substrate where the first conductive pattern is formed; selectively etching, by using a high selectivity, the second dielectric layer and the first conductive pattern formed in the region where the peripheral circuit transistor is to be formed; selectively etching, by using a high selectivity, the first dielectric layer and the first conductive pattern formed in the region where the peripheral circuit transistor is to be formed and thereby exposing the substrate; forming a third dielectric layer on a surface of the exposed substrate and on the second dielectric layer in the region where a cell transistor is formed; forming a second conductive layer on the entire surface of the substrate where the second dielectric layer is formed; and patterning the second conductive layer, second dielectric layer, third dielectric layer and first conductive pattern and thereby forming a control gate, upper dielectric layer and a floating gate.

The first conductive pattern is employed as a lower electrode of the stacked gate and formed by a polysilicon. The second dielectric layer is employed as an upper dielectric layer of the stacked gate and formed by an ONO film.

The first dielectric layer is employed as a lower dielectric layer of the stacked gate and formed by an oxide film or oxynitride film. The third dielectric layer is formed by an oxide film having a thickness of 100 Å to 300 Å.

According to a method for manufacturing a nonvolatile memory device of the present invention, the reduction of the field oxide film and micro-pitting generated on the surface of a silicon can be suppressed, to thereby prevent the deterioration of device isolation and the operational degradation of a transistor.

BRIEF DESCRIPTION OF THE DRAWINGS

The above objects and other advantages of the present invention will become more apparent by describing in detail a preferred embodiment thereof with reference to the attached drawings in which:

FIG. 11 to FIG. 18 are section views showing a method for manufacturing a nonvolatile semiconductor memory device of the present invention, taken along the line X—X of FIG. 10.

DETAILED DESCRIPTION OF THE INVENTION

The present invention will be explained in more detail with reference to the attached drawings.

Figure 10:
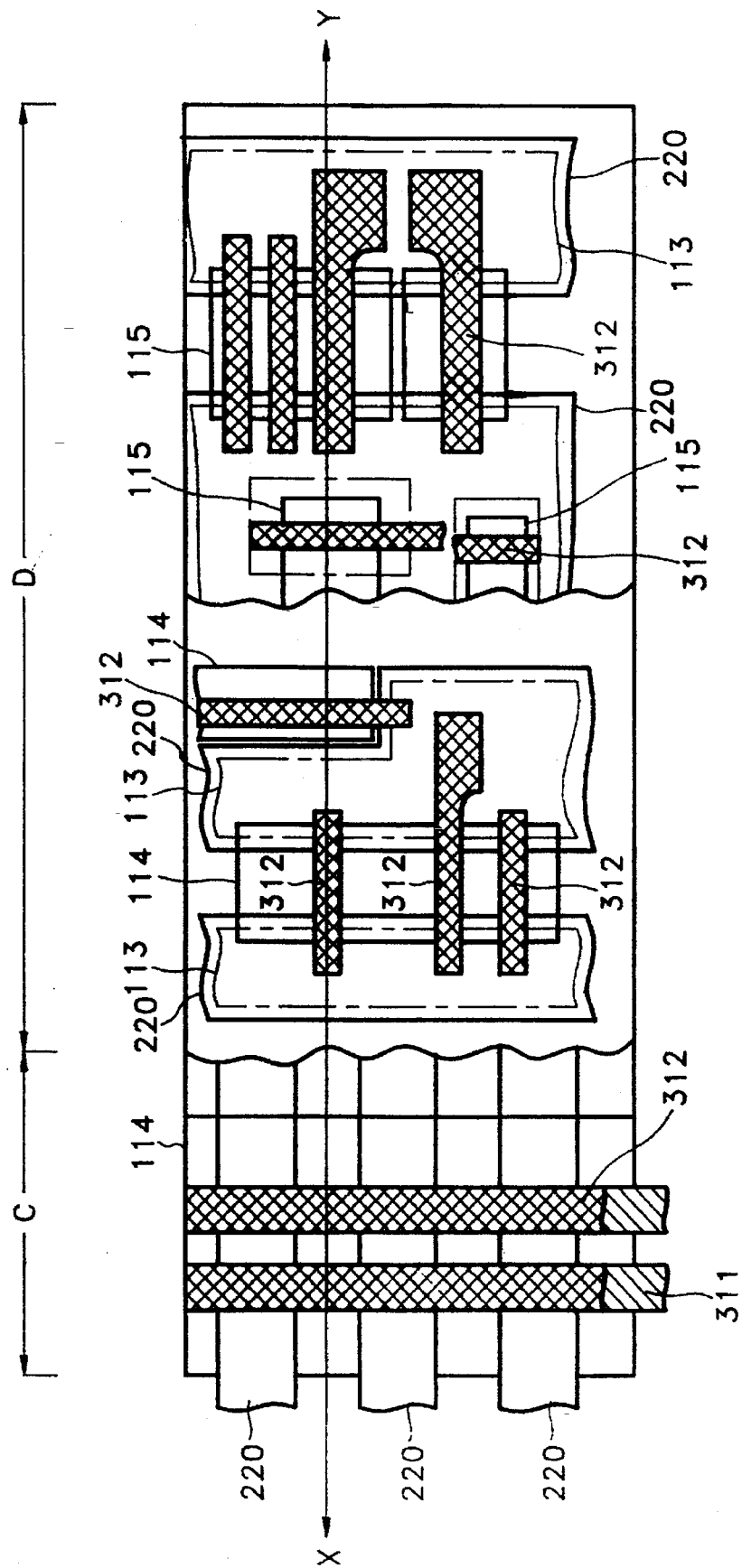
FIG. 10 is a layout of the cell array and peripheral circuit portion for illustrating a method for manufacturing a nonvolatile semiconductor device of the present invention.

FIG. 10 is a layout of the cell array and peripheral circuit portion for illustrating a method for manufacturing a nonvolatile semiconductor device of the present invention. In addition, FIG. 11 to FIG. 18 are section views showing a method for manufacturing the nonvolatile semiconductor memory device shown in FIG. 10.

As shown in FIG. 10 to FIG. 18, the nonvolatile semiconductor memory device has a memory cell array (portion C) that consists of a floating gate for storing data and a control gate for receiving an applied voltage and a peripheral circuit portion (portion D) that consists of various transistors required for driving a device. Specifically, the peripheral circuit portion (D) of FIG. 13 to FIG. 18 is a part of the peripheral circuit portion shown in FIG. 11 and FIG. 12 and is truncated for the convenience of explanation.

FIG. 11 shows the steps of forming an N-type impurity region (N-well region 111) and a P-type impurity region (P-well region 112) on a semiconductor substrate by a CMOS process.

First, an N-type impurity is injected into predetermined regions of the peripheral circuit portion of P-type silicon substrate 110 and the cell array by employing a photo-etching process and ion-implantation technique. Then, the resultant structure is heat-treated and the impurity is diffused to the desired depth, to thereby form an N-type impurity region (N-well 111). Then, in the same manner as that for forming the N-type impurity region, a P-type impurity is injected into predetermined regions of the peripheral circuit portion of P-type silicon substrate 110 and the cell array by employing a photo-etching process and ion-implantation technique. Then, the resultant structure is heat-treated and the impurity is diffused to the desired depth, to thereby form a P-type impurity region (P-well 112).

Then, for electrical isolation between devices, field oxide film 220 is formed to a thickness of 5,000 Å to 6,000 Å by employing a photo-etching process and a device isolation process (for example, LOCOS). In order to further strengthen the electrical isolation prior to forming field oxide film 220, a channel-stopping impurity (for example, boron) is ion-implanted into the region where the field oxide film of P-type impurity region 112 and cell array region is to be grown. Thus, P-type impurity 113 is formed under field oxide film 220. At this time, the channel-stopping impurity can be diffused to the part of an active region when field oxide film 220 is formed. Then, the unnecessary film material (for example, an oxide or nitride film) which is formed when field oxide film 220 is formed on a substrate and an ion-implantation is performed, is removed. Thus, the surface of the substrate is confined by field oxide film 220.

FIG. 12 shows the steps of forming first dielectric layer 211 and first conductive layer 311 all over the substrate where field oxide film 220 is formed.

An oxide film or oxynitride film having a thickness of 70 Å to 100 Å as a material for forming first dielectric layer (lower dielectric layer 211) is formed all over the substrate where field oxide film 220 is formed. First dielectric layer 211 is used as a tunnel oxide film. A conductive material for forming a floating gate on tunnel oxide film 211, for example, polycrystalline silicon, is deposited to a thickness of 1,500 Å to 2,000 Å by employing a CVD method, to thereby form first conductive layer 311. Then, POCl which contains a large quantity of phosphorous is deposited on first conductive layer 311.

Figure 13:
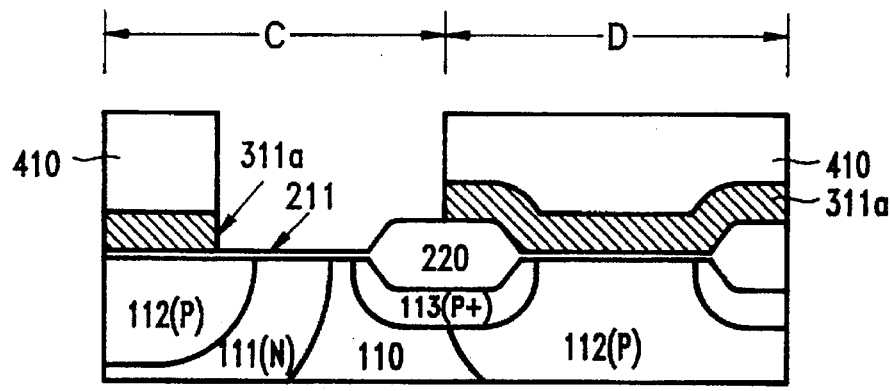

FIG. 13 shows the steps of patterning first conductive layer 311 and forming first conductive pattern 311a.

First, a photoresist is deposited on first dielectric layer 211 and the resultant structure is patterned. Thus, photoresist pattern 410 is formed in the part of the cell array and the peripheral circuit portion. Then, the conductive material formed in the peripheral circuit portion and part of the cell array is etched using photoresist pattern 410 as an etching mask, to thereby form first Conductive pattern 311a.

Figure 1:
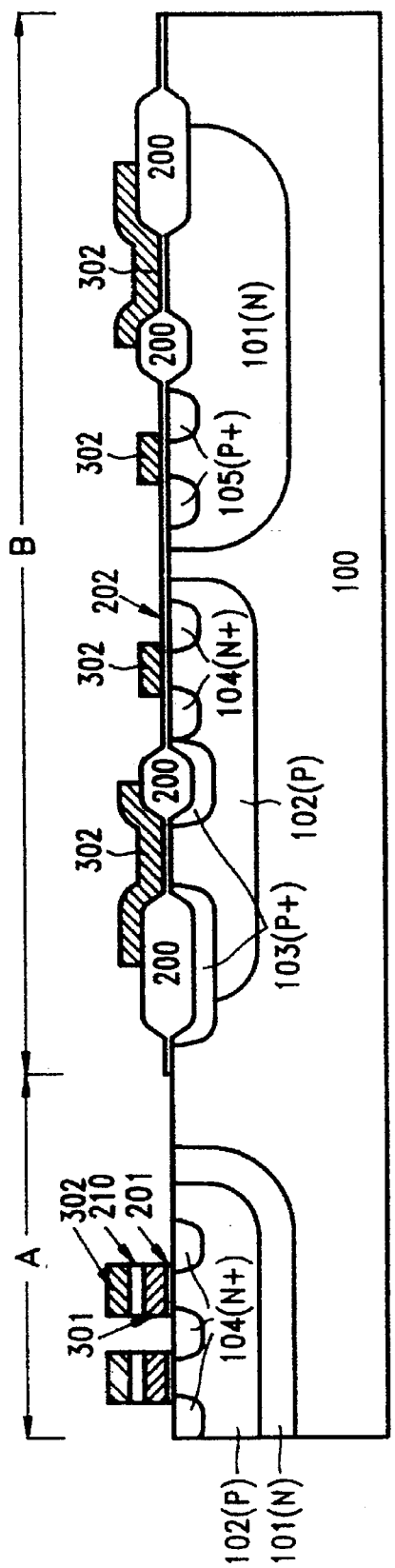
FIG. 1 is a section view showing a cell array and a peripheral circuit portion of a conventional nonvolatile semiconductor memory device.
Figure 2:
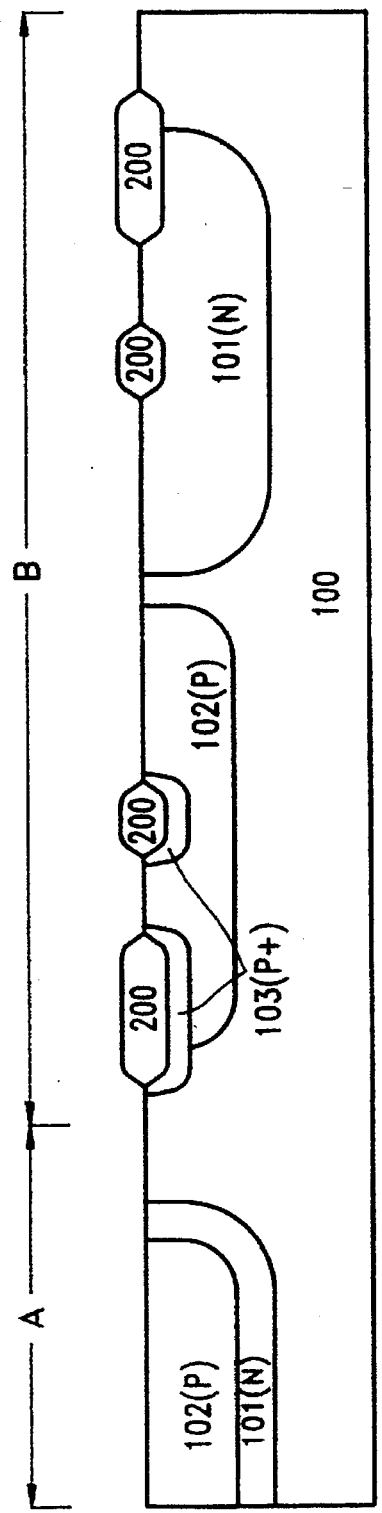
FIG. 2 to FIG. 9 are section views showing a method for manufacturing the nonvolatile semiconductor memory device shown in FIG. 1.
Figure 3:
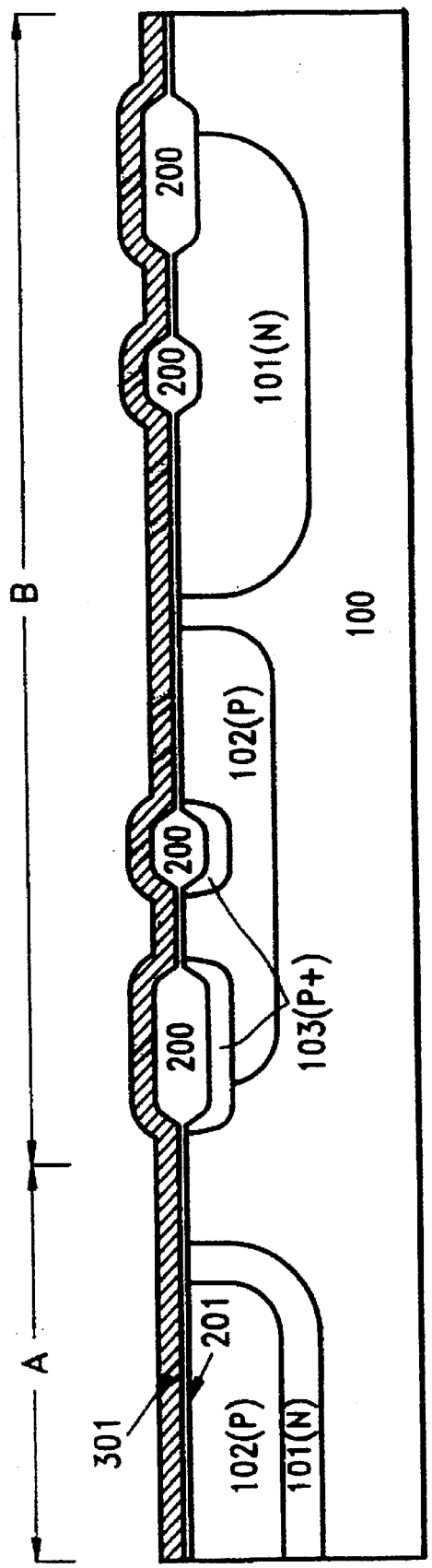
Figure 4:
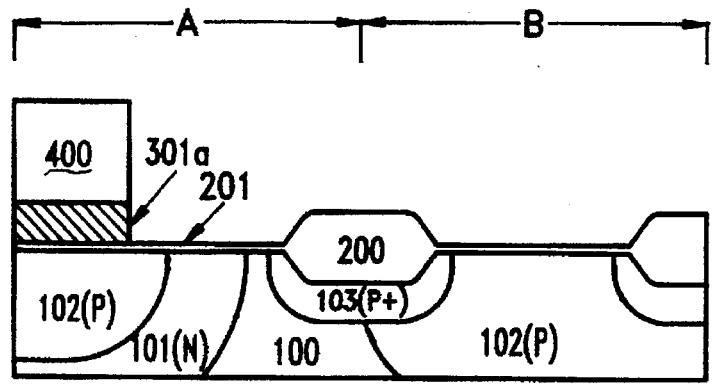
Figure 5:
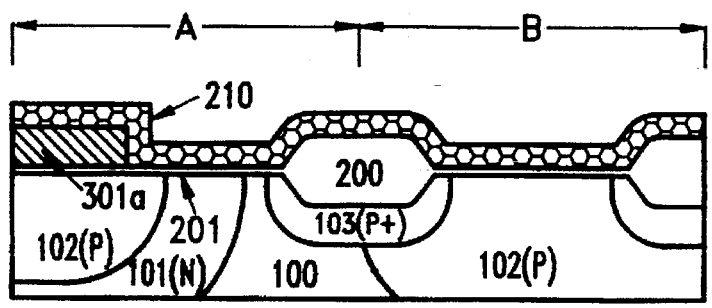

Specifically, when first conductive pattern 311a is formed, first conductive layer 311 and first dielectric layer 211 (gate oxide film in the peripheral circuit) which are formed in the peripheral circuit are not etched, differently from the step of FIG. 4. Accordingly, first dielectric layer 211 formed in the peripheral circuit portion is not exposed and first conductive pattern 311a is protected.

Figure 14:
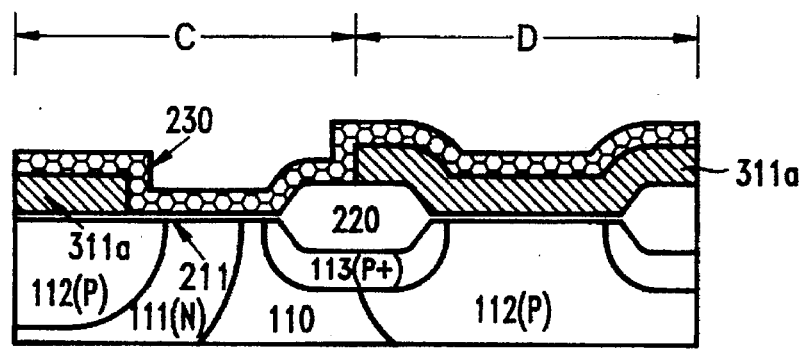

FIG. 14 shows the steps of forming second dielectric film 230 all over first conductive pattern 311a and substrate 110.

Photoresist pattern 410 which was used as an etching mask is removed, and second dielectric layer 230 is formed all over first conductive pattern 311a and substrate 110. Second dielectric layer 230 is formed of an ONO film as follows. A nitride film having a thickness of 100 Å to 200 Å is deposited on a thermal oxide film having a thickness of 40 Å to 70 Å. Then, a thermal oxidation is performed on the resultant structure so that the ONO film can be formed to total thickness of 130 Å to 200 Å when it is converted to an oxide film. The second dielectric layer formed by the ONO film isolates the first conductive layer and a second conductive layer to be formed afterwards. In addition, an ONO film having a high dielectric constant is used so that most of the voltage applied to the second electrode layer formed in the subsequent process can be applied to the floating gate.

Figure 15:
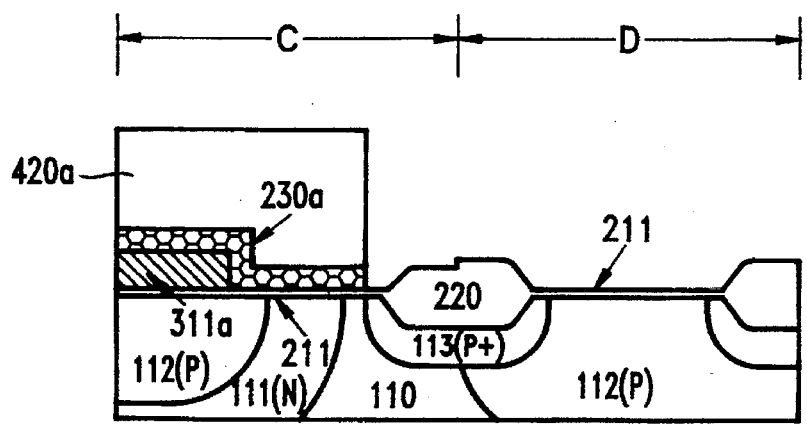

FIG. 15 shows the steps of patterning second dielectric layer 230 and forming second dielectric pattern 230a.

A photoresist is deposited on second dielectric layer 230 and the resultant structure is patterned, to thereby form photoresist pattern 420a in the cell array. Then, in order to manufacture a transistor in the peripheral circuit portion, second dielectric layer 230 and first dielectric layer 211 which are formed in the peripheral circuit portion are sequentially etched by using photoresist pattern 420a as an etching mask. When first and second dielectric layers 211 and 230 formed in the peripheral circuit portion and first conductive pattern are all etched, second dielectric pattern 230a is formed in the cell array. That is to say, the second dielectric layer formed in the peripheral circuit portion and the first conductive pattern are selectively etched and the first conductive layer and the first dielectric layer which are formed in the peripheral circuit portion are selectively etched.

Figure 6:
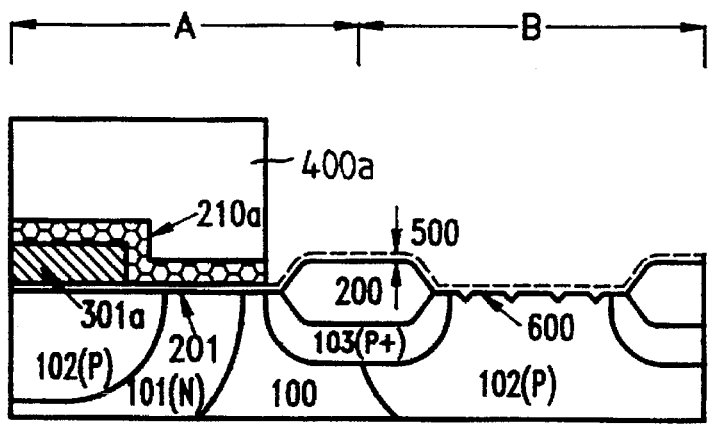
Figure 7:
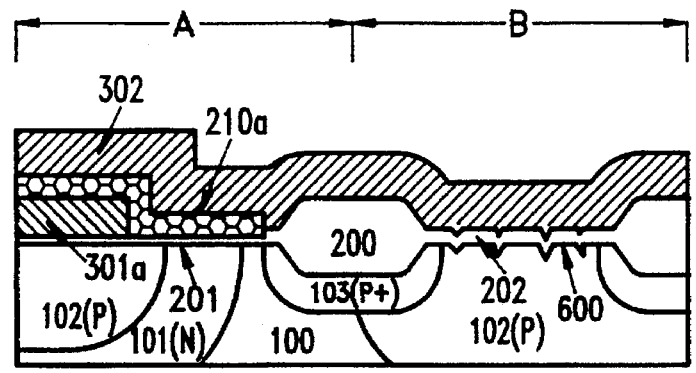
Figure 8:
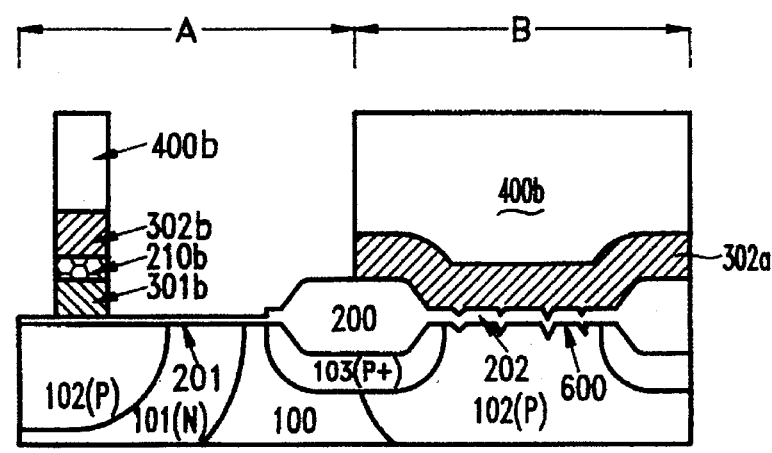
Figure 9:
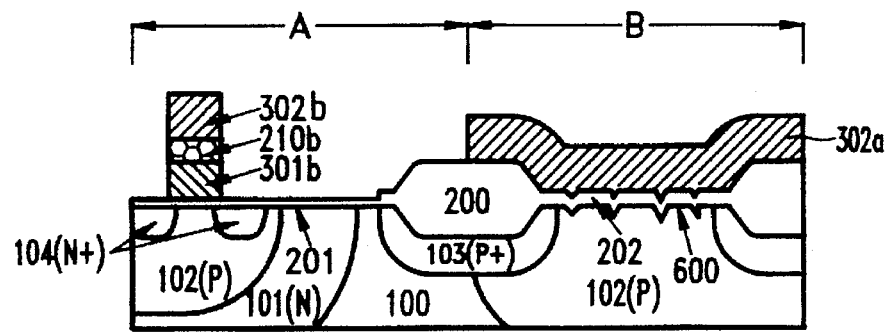

Specifically, when second dielectric layer 230 made of the above-described ONO film and formed in the peripheral circuit portion is etched, the selective ratio of second dielectric layer 230 to first conductive layer pattern 311a (made of polysilicon) or of first conductive layer pattern 311a (also of polysilicon) to first dielectric layer 211 is high, i.e., approximately 15:1 to 40:1. Therefore, the thickness of field oxide film 220 is not reduced as in the case of FIG. 6 and micro-pitting 600 is not generated in the surface of the silicon where a transistor is to be formed, even when the film formed in an upper layer is over-etched.

Figure 16:
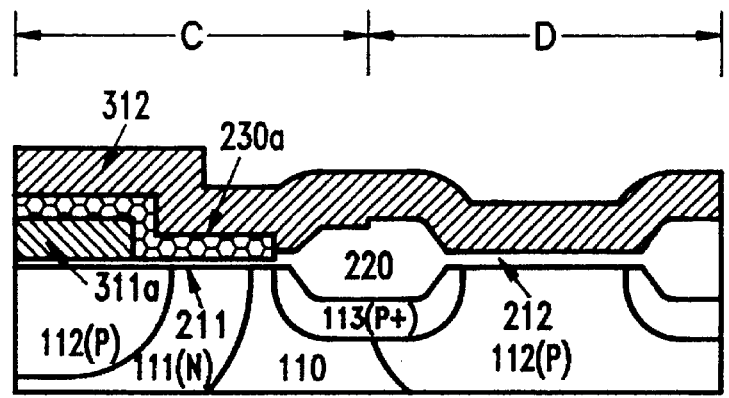

FIG. 16 shows the steps of forming dielectric film 212 and second conductive layer 312 all over the substrate where second dielectric pattern 230a is formed.

First, photoresist pattern 420a used in performing an etching of second dielectric layer 230 of the peripheral circuit portion is removed. Then, an oxide film is formed to a thickness of 200 Å to 300 Å as dielectric film 212 of a gate electrode in the peripheral circuit portion. Then, a polycrystalline silicon is formed to a thickness of 1,500 Å to 2,000 Å all over the peripheral circuit portion and cell array. Then, POCl which contains a large quantity of phosphorus is deposited so that the conductive layer can be manufactured. Then, a refractory metal silicide layer (not shown) is formed to a thickness of approximately 1,000 Å to 1,500 Å on the polycrystalline silicon layer, to thereby form second conductive layer 312.

Figure 17:
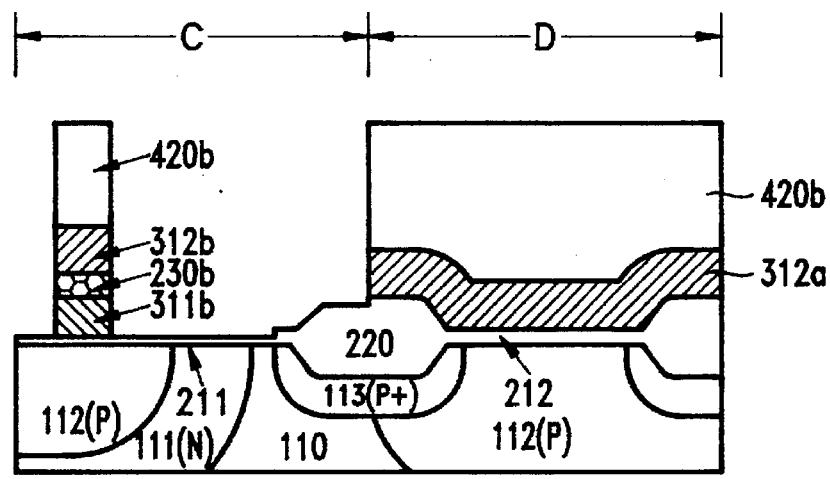

FIG. 17 shows the step of patterning second conductive layer 312.

A photoresist is deposited on second conductive layer 312 and the resultant structure is patterned, to thereby form a photoresist pattern 420b in the cell array and in part of the peripheral circuit portion. Then, second conductive layer 312, a metal silicide layer (not shown), second dielectric pattern 230a and first conductive pattern 311a are selectively etched, using photoresist pattern 420b as an etching mask.

Figure 18:
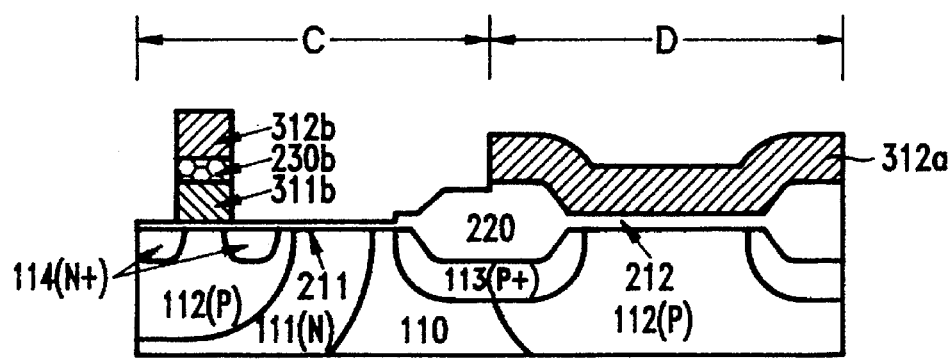

FIG. 18 shows the step of forming gate electrode 312a in the peripheral circuit portion and control gate 312b, floating gate 311b and upper dielectric layer 230b in the cell array, and forming a source and drain of a transistor.

First, photoresist pattern 420b is removed and an N-type impurity is ion-implanted by self-alignment, to thereby form N-type impurity region 114 in the cell array. Then, control gate 312b consisting of second conductive layer 312 and a metal silicide (not shown) is formed, and upper dielectric layer 230b and floating gate 311b are formed in the lower portion of control gate 312b.

In the nonvolatile semiconductor memory device of the present invention, when second dielectric layer 230 and first dielectric layer 211 which are made up of ONO film are etched in the peripheral circuit portion in order to manufacture a transistor in the peripheral circuit portion, field oxide film 220 and a lower layer (for example, the first conductive layer in case of etching the second dielectric layer and the first conductive layer) are not damaged even though the film formed in the upper layer is over-etched, because the present invention employs a high selective ratio between the second dielectric layer formed by an ONO film and first conductive layer 311a formed by a polysilicon or between first conductive layer 311a formed by a polysilicon and first dielectric layer 211. Accordingly, conventional problems such as micro-pitting 600 being generated in the surface of the silicon where a transistor is to be formed and thickness of the field oxide film being decreased, can be solved.

The nonvolatile memory device of the present invention suppresses the reduction of the field oxide film and the generation of the pitting on the surface of the silicon, to thereby prevent the deterioration of device isolation and the degradation of operational performance.

It will be understood by those skilled in the art that the foregoing description is merely a preferred embodiment of the disclosed device and that various changes and modifications may be made in the invention without departing from the spirit and scope thereof.

What is claimed is:

1. A method for manufacturing a nonvolatile memory device having a memory cell array portion and a peripheral circuit portion, comprising the steps of:

forming a field oxide layer on a major surface of a semiconductor substrate, said field oxide layer having first portions separated by second portions, with said first portions being thicker than said second portions;

forming a first dielectric layer on said second portions of said field oxide layer;

forming a first conductive layer on said first dielectric layer and on said first portions of said field oxide layer;

removing a first portion of said first conductive layer disposed in said memory cell array portion, and adjacent to said peripheral circuit portion, to thereby expose a portion of said first dielectric layer disposed in said memory cell array portion;

forming a second dielectric layer on remaining, second portions of said first conductive layer and on said exposed portion of said first dielectric layer disposed in said memory cell array portion;

removing a first portion of said second dielectric layer disposed in said peripheral circuit portion and an adjoining marginal edge portion of said memory cell array portion, and an underlying second portion of said first conductive layer disposed in said peripheral circuit portion, to thereby expose portions of said first dielectric layer disposed in said peripheral circuit portion, and said field oxide regions;

removing said exposed portions of said first dielectric layer disposed in said peripheral circuit portion, to thereby expose underlying portions of said major surface of said substrate;

forming a third dielectric layer on said exposed portions of said major surface of said substrate;

forming a second conductive layer on said exposed first portions of said field oxide layer, said third dielectric layer, and a remaining, second portion of said second dielectric layer disposed in said memory cell array portion; and, removing selected portions of said second conductive layer disposed in said memory cell array portion, and underlying portions of said second portion of said second dielectric layer and said second portion of said first conductive layer disposed in said memory cell array portion, to thereby form a stacked gate structure in said memory cell array portion, wherein a remaining portion of said second conductive layer serves as a control gate, and said underlying portion of said second portion of said first conductive layer disposed in said memory cell array portion serves as a floating gate.

2. The method as set forth in claim 1, wherein each of the removing steps is carried out by using a selective etching process.

3. The method as set forth in claim 1, wherein said first dielectric layer is comprised of a dielectric material selected from the group consisting of oxides and oxynitrides.

4. The method as set forth in claim 1, wherein said second dielectric layer comprises a composite ONO layer.

5. The method as set forth in claim 3, wherein said second dielectric layer comprises a composite ONO layer.

6. The method as set forth in claim 4, wherein the step of forming a second dielectric layer includes the sub-steps of:

forming an oxide film on said remaining, second portions of said first conductive layer and on said exposed portion of said first dielectric layer;

forming a nitride film on said oxide film, to thereby form an oxide/nitride film structure; and, thermally oxidizing said oxide/nitride film structure to form said composite ONO layer.

7. The method as set forth in claim 4, wherein the step of forming a second dielectric layer includes the sub-steps of:

forming an oxide film having a thickness of 40–70 angstroms on said remaining, second portions of said first conductive layer and on said exposed portion of said first dielectric layer;

forming a nitride film having a thickness of 100–200 angstroms on said oxide film, to thereby form an oxide/nitride film structure; and, thermally oxidizing said oxide/nitride film structure to form said composite ONO layer to a thickness of 130–200 angstroms.

8. The method as set forth in claim 5, wherein said third dielectric layer comprises an oxide layer.

9. The method as set forth in claim 1, wherein said first conductive layer is comprised of polysilicon and said second conductive layer is comprised of a composite of polysilicon and a metal-silicon material.

10. The method as set forth in claim 9, wherein said metal-silicon material comprises a tungsten-silicon material.

11. A method for manufacturing a nonvolatile memory device having a memory cell array portion and a peripheral circuit portion, comprising the steps of:

forming a plurality of spaced-apart field oxide regions in a surface region of a semiconductor substrate, in said peripheral circuit portion;

forming a first dielectric layer on exposed surface portions of said substrate;

forming a first conductive layer on a first resultant structure obtained by the preceding steps;

removing a first portion of said first conductive layer disposed in said memory cell array portion, and adjacent to said peripheral circuit portion, to thereby expose a corresponding portion of said first dielectric layer disposed in said memory cell array portion;

forming a second dielectric layer on remaining, second portions of said first conductive layer and on said exposed portion of said first dielectric layer disposed in said memory cell array portion;

removing a first portion of said second dielectric layer disposed in said peripheral circuit portion and an adjoining marginal edge portion of said memory cell array portion, and an underlying second portion of said first conductive layer disposed in said peripheral circuit portion, to thereby expose portions of said first dielectric layer disposed in said peripheral circuit portion;

removing said exposed portions of said first dielectric layer disposed in said peripheral circuit portion, to thereby expose underlying surface portions of said substrate;

forming a third dielectric layer on said exposed surface portions of said substrate;

forming a second conductive layer on a second resultant structure obtained by the preceding steps; and, removing selected portions of said second conductive layer disposed in said memory cell array portion, and underlying portions of said second portion of said second dielectric layer and said second portion of said first conductive layer disposed in said memory cell array portion, to thereby form a stacked gate structure in said memory cell array portion, wherein a remaining portion of said second conductive layer serves as a control gate, and said underlying portion of said second portion of said first conductive layer disposed in said memory cell array portion serves as a floating gate.

12. The method as set forth in claim 11, wherein each of the removing steps is carried out by using a selective etching process.

13. The method as set forth in claim 11, wherein said first dielectric layer is comprised of a dielectric material selected from the group consisting of oxides and oxynitrides.

14. The method as set forth in claim 11, wherein said second dielectric layer comprises a composite ONO layer.

15. The method as set forth in claim 13, wherein said second dielectric layer comprises a composite ONO layer.

16. The method as set forth in claim 14, wherein the step of forming a second dielectric layer includes the sub-steps of:

forming an oxide film on said remaining, second portions of said first conductive layer and on said exposed portion of said first dielectric layer;

forming a nitride film on said oxide film, to thereby form an oxide/nitride film structure; and, thermally oxidizing said oxide/nitride film structure to form said composite ONO layer.

17. The method as set forth in claim 14, wherein the step of forming a second dielectric layer includes the sub-steps of:

forming an oxide film having a thickness of 40–70 angstroms on said remaining, second portions of said first conductive layer and on said exposed portion of said first dielectric layer;

forming a nitride film having a thickness of 100–200 angstroms on said oxide film, to thereby form an oxide/nitride film structure; and, thermally oxidizing said oxide/nitride film structure to form said composite ONO layer to a thickness of 130–200 angstroms.

18. The method as set forth in claim 15, wherein said third dielectric layer comprises an oxide layer.

19. The method as set forth in claim 11, wherein said first conductive layer is comprised of polysilicon and said second conductive layer is comprised of a composite of polysilicon and a metal-silicon material.

20. The method as set forth in claim 19, wherein said metal-silicon material comprises a tungsten-silicon material.

* * * * *